(12) United States Patent
Harms (10) Patent No.: US 7,742,785 B2
(45) Date of Patent: Jun. 22, 2010

(54) REFERENCE SIGNAL GENERATION FOR MULTIPLE COMMUNICATION SYSTEMS

(75) Inventor: Brian K. Harms, Boulder, CO (US)

(73) Assignee: QUALCOMM Incorporated, San Diego, CA (US)

( * ) Notice: Subject to any disclaimer, the term of this patent is extended or adjusted under 35 U.S.C. 154(b) by 586 days.

(21) Appl. No.: 11/502,232

(22) Filed: Aug. 9, 2006

(65) Prior Publication Data

US 2008/0085693 A1    Apr. 10, 2008

(51) Int. Cl.
H04M 1/00    (2006.01)
(52) U.S. Cl. .................. 455/552.1; 455/255; 455/265; 455/313
(58) Field of Classification Search ......... 455/255–265, 455/313–334, 226.1–226.4, 67.11–67.14
See application file for complete search history.

(56) References Cited

U.S. PATENT DOCUMENTS

| | | | | |
|---|---|---|---|---|
| 5,465,402 A | * | 11/1995 | Ono et al. | 455/265 |
| 5,603,109 A | * | 2/1997 | Feeney | 455/192.2 |
| 5,604,468 A | | 2/1997 | Gillig | |
| 5,815,042 A | * | 9/1998 | Chow et al. | 455/255 |
| 6,307,441 B1 | * | 10/2001 | Sharpe | 331/18 |
| 6,335,953 B1 | * | 1/2002 | Sanderford et al. | 455/67.14 |
| 6,876,874 B2 | | 4/2005 | Arnaud et al. | |
| 7,113,751 B2 | * | 9/2006 | Barak | 455/260 |
| 7,205,850 B2 | * | 4/2007 | Uozumi et al. | 331/23 |
| 7,239,857 B2 | * | 7/2007 | Abraham | 455/255 |
| 7,486,145 B2 | * | 2/2009 | Floyd et al. | 331/16 |
| 7,498,986 B2 | * | 3/2009 | Thomas | 342/465 |
| 2004/0183601 A1 | * | 9/2004 | Zhang | 331/16 |
| 2005/0079846 A1 | * | 4/2005 | Sendonaris et al. | 455/255 |
| 2006/0111141 A1 | * | 5/2006 | Smith et al. | 455/553.1 |

(Continued)

FOREIGN PATENT DOCUMENTS

EP    1206039    5/2002

(Continued)

OTHER PUBLICATIONS

Scott Meninger, "Sigma-Delta Fractional-N Frequency Synthesis," MIT, Jun. 7, 2004.

(Continued)

*Primary Examiner*—Lana N Le
(74) *Attorney, Agent, or Firm*—Jiayu Xu (57) ABSTRACT

Techniques for generating reference signals for multiple communication systems are described. An apparatus comprises a reference oscillator, a frequency control unit, and a plurality of frequency synthesizers. The reference oscillator generates a main reference signal and may be a crystal oscillator or some other type of oscillator. The frequency control unit estimates the frequency error of the main reference signal and provides a frequency error estimate. The plurality of frequency synthesizers receive the main reference signal and generate a plurality of system reference signals for a plurality of systems. At least one (e.g., each) frequency synthesizer corrects the frequency error of the main reference signal based on the frequency error estimate from the frequency control unit. Each frequency synthesizer may include a sigma-delta modulator used to generate a divider control for a phase locked loop (PLL). The divider control corrects for the frequency error of the main reference signal.

35 Claims, 7 Drawing Sheets

U.S. PATENT DOCUMENTS

2006/0121864 A1* 6/2006 Rodgers et al. .......... 455/182.1
2008/0129600 A1* 6/2008 Thomas ...................... 342/465

FOREIGN PATENT DOCUMENTS

| EP | 1213830 | 6/2002 |
| EP | 1467518 A1 | 10/2004 |
| WO | 2004091231 A1 | 10/2004 |

OTHER PUBLICATIONS

De Muer and Steyaert, "On the Analysis of Delta Sigma Fractional-N Frequency Synthesizers for High-Spectral Purity," IEEE Transactions on Circuits and Systems, Nov. 2003.

Riley, Copeland and Kwasniewski, "Delta-Sigma Modulation in Fractional-N Frequency Synthesis", IEEE Journal of Circuits and Systems, May 1993.

Roermund, et al., "Analog Circuit Design: Fractional-N Synthesizers, Design for Robustness, Line and Bus Drivers," Jan. 1, 2003, Kluwer, paragraph 4.1.3.

International Search Report—PCT/US07/075328, International Search Authority—European Patent Office, Sep. 15, 2008.

Written Opinion—PCT/US07/075328, International Search Authority—European Patent Office, Sep. 15, 2008.

* cited by examiner

REFERENCE SIGNAL GENERATION FOR MULTIPLE COMMUNICATION SYSTEMS

BACKGROUND

I. Field

The present disclosure relates generally to communication, and more specifically to techniques for generating reference signals for multiple communication systems.

II. Background

A wireless device (e.g., a cellular phone) may be designed to support multiple communication systems. These systems may have different carrier frequencies and chip rates. Each system may also have certain requirements on clock signals used for digital processing and local oscillator (LO) signals used for frequency downconversion and/or upconversion.

Separate clock and LO generation circuits may be used for each system supported by the wireless device and may be designed to meet all requirements of that system. The clock and LO generation circuits for each system may include, e.g., a voltage controlled temperature compensated crystal oscillator (VCTCXO) and one or more phase locked loops (PLLs). The VCTCXO generates a reference signal having an accurate frequency and may be locked to the carrier frequency or the chip rate of the system. The PLL(s) may be locked to the reference signal and used to generate the required clock and LO signals, which would then have the same frequency accuracy as the reference signal.

If the wireless device supports multiple systems, then multiple sets of clock and LO generation circuits may be used for these systems. These clock and LO generation circuits, although effective, increase design complexity as well as cost for the wireless device.

There is therefore a need in the art for techniques to support multiple communication systems in an efficient and cost effective manner.

SUMMARY

Techniques for generating reference signals for multiple communication systems are described herein. In an embodiment, an apparatus comprises a reference oscillator, a frequency control unit, and a plurality of frequency synthesizers. The reference oscillator generates a main reference signal and may be a crystal oscillator or some other type of oscillator. The frequency control unit estimates the frequency error of the main reference signal and provides a frequency error estimate. The plurality of frequency synthesizers receive the main reference signal and generate a plurality of system reference signals for a plurality of systems. At least one (e.g., each) frequency synthesizer corrects the frequency error of the main reference signal based on the frequency error estimate from the frequency control unit.

In an embodiment, each frequency synthesizer comprises a divider control unit, a sigma-delta (ΣΔ) modulator, and a phase locked loop (PLL). The divider control unit generates a divider ratio for an associated system based on the frequency error estimate and possibly a slew control for the system. The sigma-delta modulator generates a divider control for the PLL based on an output from the divider control unit. The PLL includes a divider that divides an oscillator signal by different integer values determined by the divider control.

In an embodiment, the frequency control unit includes a filter and a database of frequency error versus temperature. The filter derives the frequency error estimate based on initial estimates of the frequency error of the main reference signal, which may be derived from a pilot of a designated (e.g., CDMA) system. The database stores frequency error versus temperature, receives a temperature measurement, and provides a frequency error corresponding to the temperature measurement as the frequency error estimate for the main reference signal. Either the filter or the database may be used at any given moment to provide the frequency error estimate, e.g., depending on whether the designated system is being received.

Various aspects and embodiments of the disclosure are described in further detail below.

BRIEF DESCRIPTION OF THE DRAWINGS

Aspects and embodiments of the disclosure will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
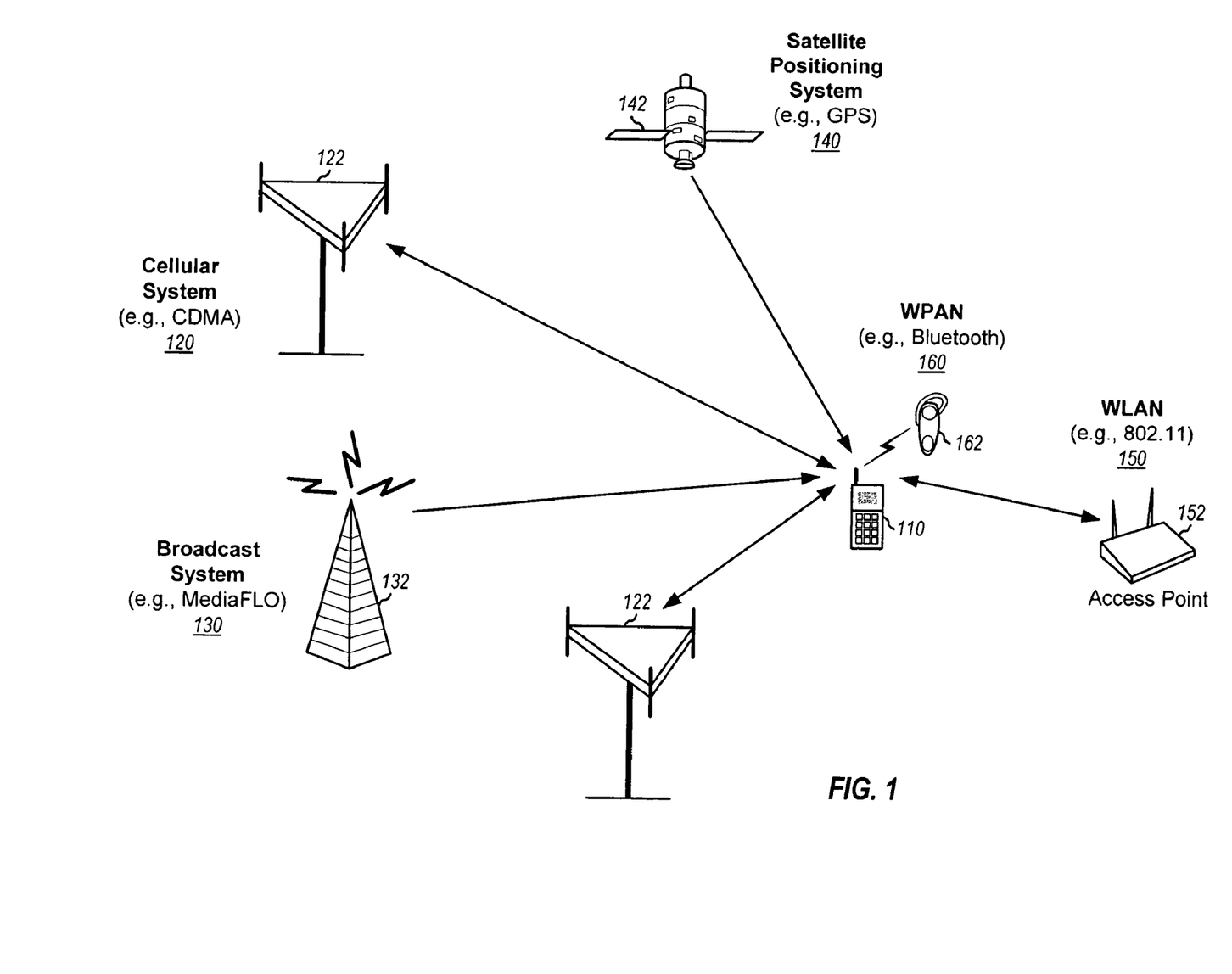
FIG. 1 shows a wireless device communicating with multiple systems.

FIG. 1 shows a wireless device 110 capable of communicating with multiple communication systems. These systems may include a cellular system 120, a broadcast system 130, a satellite positioning system 140, a wireless local area network (WLAN) 150, a wireless personal area network (WPAN) 160, some other systems or networks, or any combination thereof. The terms "system" and "network" are often used interchangeably.

Cellular system 120 may be a Code Division Multiple Access (CDMA) system, a Time Division Multiple Access (TDMA) system, a Frequency Division Multiple Access (FDMA) system, an Orthogonal FDMA (OFDMA) system, a Single-Carrier FDMA (SC-FDMA) system, or some other cellular system. A CDMA system may utilize a radio technology/air interface such as cdma2000, Wideband-CDMA (W-CDMA), and so on. cdma2000 covers IS-95, IS-2000 and IS-856 standards. A TDMA system may utilize a radio technology such as Global System for Mobile Communications (GSM), Digital Advanced Mobile Phone System (D-AMPS), and so on. D-AMPS covers IS-136 and IS-54 standards. These various cellular systems, radio technologies, and standards are known in the art. Cellular system 120 may be a Universal Mobile Telecommunication System (UMTS) that implements W-CDMA, a CDMA2000 1x system that implements IS-2000 and/or IS-95, a CDMA2000 1xEV-DO system that implements IS-856, a GSM system, or some other system.

Broadcast system 130 may be a MediaFLO system, a Digital Video Broadcasting for Handhelds (DVB-H) system, an Integrated Services Digital Broadcasting for Terrestrial Television Broadcasting (ISDB-T) system, or some other broadcast system. These various broadcast systems are known in the art.

Satellite positioning system 140 may be the United States Global Positioning System (GPS), the Russian Glonass system, the European Galileo system, or some other satellite positioning system. The following description assumes that system 140 is GPS. GPS is a constellation of 24 well-spaced satellites plus some spare satellites that orbit the earth. Each GPS satellite transmits an encoded signal that allows receivers on earth to accurately estimate their positions based on measurements for a sufficient number of satellites (typically four) and the known locations of these satellites.

WLAN 150 may implement IEEE 802.11, which is a family of standards from The Institute of Electrical and Electronics Engineers (IEEE). The IEEE 802.11 standards specify the radio interface between access points and stations. Currently, 802.11a, 802.11b and 802.11g standards are widely used. Each IEEE 802.11 standard specifies operation at a specific frequency band (e.g., 2.4 GHz or 5 GHz) using one or more modulation techniques.

WPAN 160 may implement Bluetooth, which is a short-range radio technology that is adopted as IEEE 802.15 standard. Bluetooth supports communication between wireless device 110 and Bluetooth devices, e.g., a headset 162.

As shown in FIG. 1, wireless device 110 may communicate with one or more base stations 122 in cellular system 120, one or more broadcast stations 132 in broadcast system 130, one or more GPS satellites 142, one or more access points 152 in WLAN 150, and/or one or more Bluetooth devices in WPAN 160. The communication with each system may be bi-directional (both transmit and receive) or unidirectional (only receive). In general, wireless device 110 may communicate with any number of systems and any one of the systems at any given moment.

Wireless device 110 may be fixed or mobile and may also be referred to as a mobile station, a user equipment, a terminal, a station, a subscriber unit, and so on. Wireless device 110 may be a cellular phone, a personal digital assistant (PDA), a wireless modem, a handheld device, and so on. For clarity, much of the following description is for an embodiment in which wireless device 110 is capable of communicating with a CDMA system, GPS, and Bluetooth. The CDMA system may be a UMTS, CDMA 1X, or CDMA 1xEV-DO system.

Figure 2:
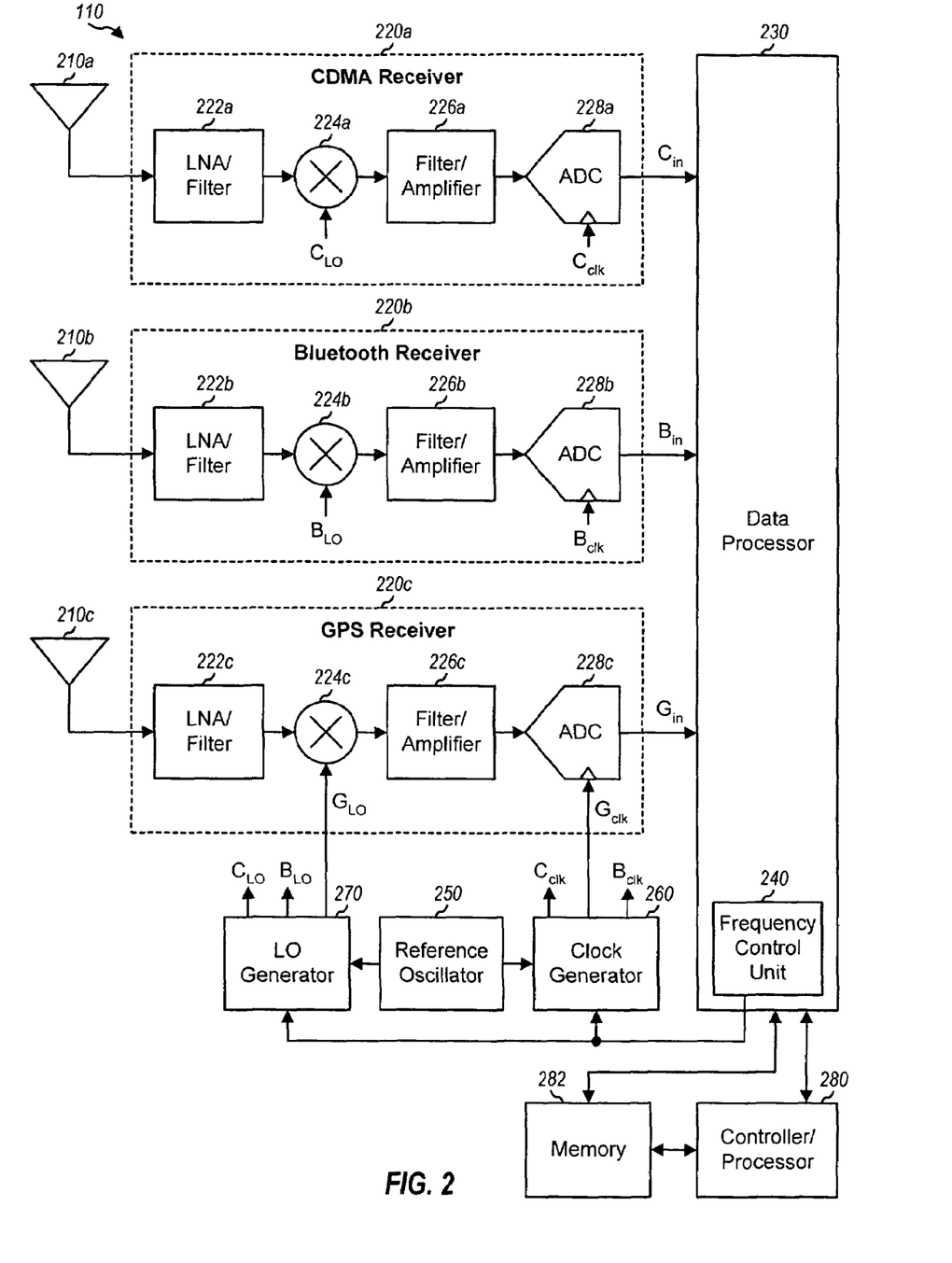
FIG. 2 shows a block diagram of the wireless device.

FIG. 2 shows a block diagram of an embodiment of wireless device 110. In this embodiment, wireless device 110 includes an antenna 210a and a receiver 220a for CDMA, an antenna 210b and a receiver 220b for Bluetooth, and an antenna 210c and a receiver 220c for GPS. In general, wireless device 110 may include any number of antennas and any number of receivers for any number of systems. Multiple systems may share an antenna if the antenna can provide acceptable performance for these systems. Multiple systems may also share a receiver if these systems are not received simultaneously. Multiple antennas and/or multiple receivers may also be used for a given system, e.g., to achieve receive diversity and/or to receive signals in different frequency bands (e.g., cellular and PCS bands).

For CDMA, antenna 210a receives signals transmitted by base stations 122 and provides a received radio frequency (RF) signal to receiver 220a. Within receiver 220a, a low noise amplifier (LNA) 222a amplifies the received RF signal and provides an amplified RF signal. A filter 222a filters the amplified RF signal to pass signal components in the band of interest and to remove out-of-band noise and undesired signals. A mixer 224a frequency downconverts the filtered RF signal with an LO signal CLO from an LO generator 270 and provides a downconverted signal. The frequency of the CLO signal is selected such that the signal component in an RF channel of interest is downconverted to baseband or near-baseband. A lowpass filter 226a filters the downconverted signal to pass the signal components in the RF channel of interest and to remove noise and undesired signals. An amplifier 226a amplifies the filtered baseband signal and provides an output baseband signal. An analog-to-digital converter (ADC) 228a digitizes the output baseband signal and provides input samples $C_{in}$ to a data processor 230.

Antenna 210b and receiver 220b similarly receive and process signals from Bluetooth devices in WPAN 160 and provide input samples $B_{in}$ to data processor 230. Antenna 210c and receiver 220c receive and process signals from GPS satellites and provide input samples $G_{in}$ to data processor 230. Although not shown in FIG. 2 for simplicity, the $C_{in}$, $B_{in}$ and $G_{in}$ input samples may be complex-valued samples having inphase (I) and quadrature (Q) components.

FIG. 2 shows a specific design for receivers 220a, 220b and 220c. In general, a receiver may implement a direct-to-baseband architecture that performs frequency downconversion in a single stage (as shown in FIG. 2) or a super-heterodyne architecture that performs frequency downconversion in multiple stages. A receiver may also perform signal conditioning with one or more stages of amplifier, filter, mixer, and so on.

Data processor 230 processes the $C_{in}$, $B_{in}$ and $G_{in}$ input samples and provides output data for each system. The processing for each system is dependent on the radio technology used by that system and may include demodulation, decoding, and so on. Data processor 230 is shown as a single processor in FIG. 2 but may comprise one or more application specific integrated circuits (ASICs), digital signal processors (DSPs), processors, and so on.

In an embodiment, a frequency control unit 240 estimates the frequency error of a reference oscillator 250 and generates a frequency error estimate. Reference oscillator 250 generates a main reference signal having a frequency of $f_{ref}$, which is relatively precise. In general, reference oscillator 250 may be a crystal oscillator (XO), a voltage controlled crystal oscillator (VCXO), a temperature compensated crystal oscillator (TCXO), a VCTCXO, or some other type of oscillator. In an embodiment that is described in detail below, reference oscillator 250 is a crystal oscillator. A clock generator 260 receives the main reference signal and the frequency error estimate and generates sampling clocks for ADCs 228a, 228b and 228c and possibly other clock signals for CDMA, Bluetooth, and GPS processing within data processor 230. LO generator 270 also receives the main reference signal and the frequency error estimate and generates the LO signals for receivers 220a, 220b and 220c. Clock generator 260 and LO generator 270 may be implemented as described below.

A controller/processor 280 directs the operation of various units at wireless device 110. Controller/processor 280 may determine which system(s) and/or RF channel(s) to receive. A memory 282 stores program codes and data for wireless device 110.

For simplicity, the transmitters for CDMA and Bluetooth are not shown in FIG. 2. Each transmitter may include one or more stages of amplifier, filter, mixer, power amplifier, and so on. LO generator 270 may also generate the LO signals for the transmitters based on the main reference signal from reference oscillator 250.

In the embodiment shown in FIG. 2, a single reference oscillator 250 is used as the reference frequency for all systems supported by wireless device 110. Clock and LO signals with sufficient frequency accuracy may be generated for all systems based on reference oscillator 250. This embodiment may reduce cost and complexity for wireless device 110.

Figure 3:
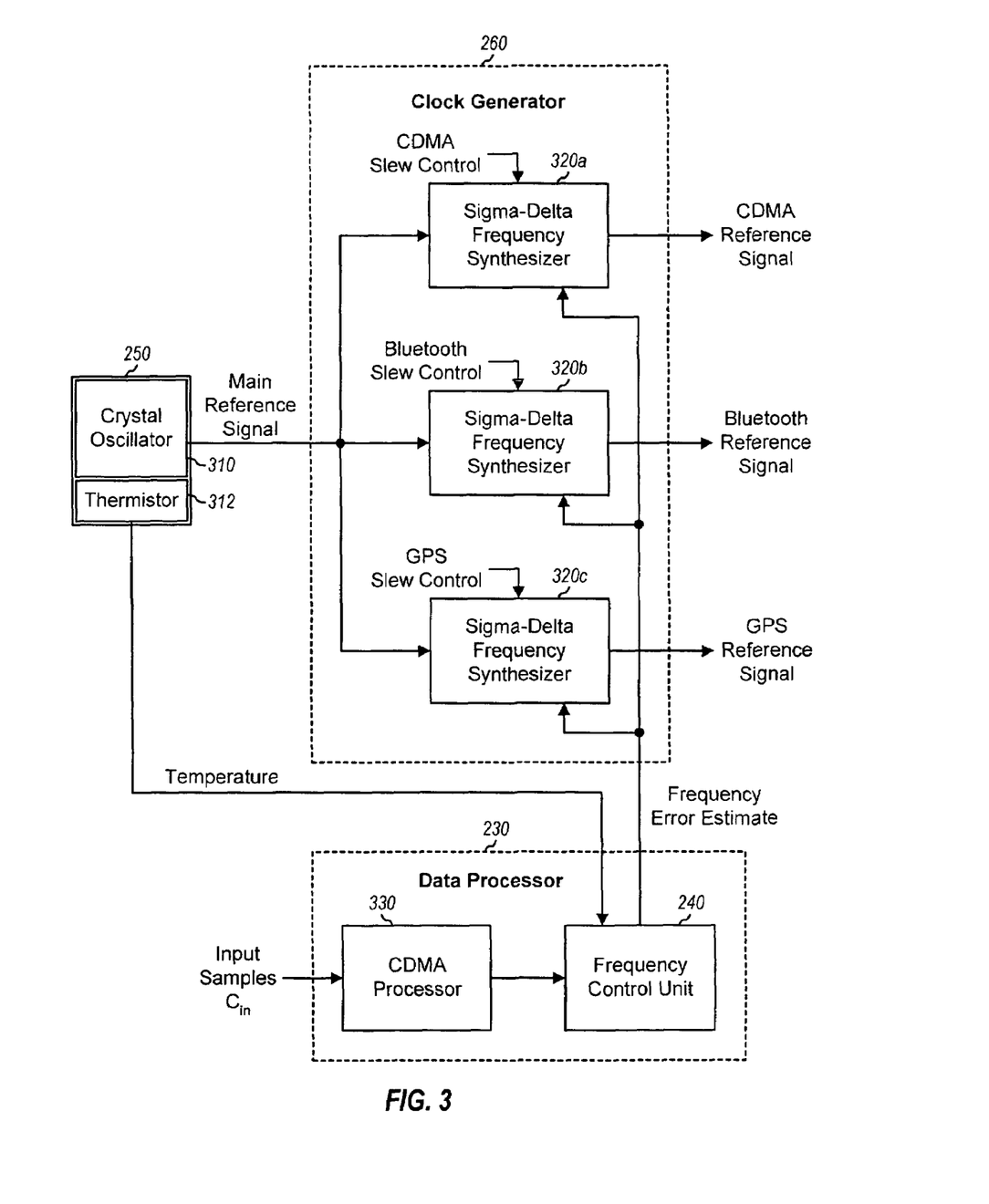
FIG. 3 shows a reference oscillator and a clock generator.

FIG. 3 shows a block diagram of an embodiment of reference oscillator 250, clock generator 260, and data processor 230 in FIG. 2. In this embodiment, reference oscillator 250 includes a crystal oscillator 310 and a thermistor 312. Crystal oscillator 310 generates the main reference signal having a frequency of $f_{ref}$ and good phase noise characteristics. As a specific example, crystal oscillator 310 may generate a 19.2 MHz main reference signal. In an embodiment, crystal oscillator 310 is not voltage controlled and is also not compensated for temperature, which may reduce cost and complexity. The main reference signal from crystal oscillator 310 is relatively accurate but may have frequency error due to various sources such as temperature, circuit component variations, power supply, aging, and so on. The reference frequency drifts with temperature and has a temperature dependent frequency error. This frequency error may be accounted for as described below.

Thermistor 312 senses the temperature near crystal oscillator 310 and provides a temperature measurement indicative of the sensed temperature. The temperature measurement may be used to compensate for frequency error due to temperature, as described below. Thermistor 312 may be implemented in a manner known in the art and may be located close to crystal oscillator 310 in order to obtain an accurate measurement of the temperature observed by crystal oscillator 310.

In the embodiment shown in FIG. 3, clock generator 260 includes sigma-delta ($\Sigma\Delta$) frequency synthesizers 320a, 320b and 320c for CDMA, Bluetooth, and GPS, respectively. Synthesizer 320a receives the main reference signal from crystal oscillator 310, the frequency error estimate from frequency control unit 240, and a CDMA slew control, e.g., from data processor 230 or controller 280. Frequency synthesizer 320a generates a CDMA reference signal having an accurate frequency based on all of the inputs, as described below. Frequency synthesizer 320b receives the main reference signal, the frequency error estimate, and a Bluetooth slew control and generates a Bluetooth reference signal. Frequency synthesizer 320c receives the main reference signal, the frequency error estimate, and a GPS slew control and generates a GPS reference signal. Each system reference signal may be a clock signal, a signal used to generate a clock signal, or some other signal.

In the embodiment shown in FIG. 3, the frequency error of reference oscillator 250 is estimated based on the CDMA system and provided to the frequency synthesizers for all systems. CDMA has good frequency accuracy, and frequency correction based on CDMA may be sufficient for all systems.

Data processor 230 includes a CDMA processor 330 that receives the $C_{in}$ input samples from receiver 220a. CDMA processor 330 processes the $C_{in}$ input samples and provides initial estimates of the frequency error of crystal oscillator 310. Frequency control unit 240 derives the frequency error estimate based on the initial estimates from CDMA processor 330 and provides the frequency error estimate to all frequency synthesizers 320a, 320b and 320c. These frequency synthesizers may correct the frequency error of the main reference signal based on the frequency error estimate.

In the embodiment shown in FIG. 3, frequency synthesizers 320a, 320b and 320c receive CDMA, Bluetooth and GPS slew controls, respectively. Each slew control may be used to control the operation of the associated frequency synthesizer. A slew control may be used for the following:

Allow a frequency synthesizer to update its frequency based on the frequency error estimate or freeze the frequency synthesizer, Limit how rapidly the frequency synthesizer can adjust its frequency, and Limit how much the frequency synthesizer can adjust its frequency.

A slew control may also be used to control other operations of a frequency synthesizer to obtain the desired performance for the associated system. For example, GPS may require a very stable frequency when integrating over a long period of time in order to obtain a precise GPS measurement. The GPS slew control may freeze frequency synthesizer 320c during the integration period to achieve a stable frequency for the GPS measurement. The GPS slew control may then enable frequency synthesizer 320c after completing the integration and allow the frequency synthesizer to be updated.

In another embodiment, frequency correction is performed independently for each system based on a received signal for that system. Each system may have a receive data processor and a frequency control unit. The receive data processor processes the input samples for the system and provides initial estimates of frequency error for the system. The frequency control unit receives the initial estimates and generates a frequency error estimate for the frequency synthesizer for that system.

Figure 4:
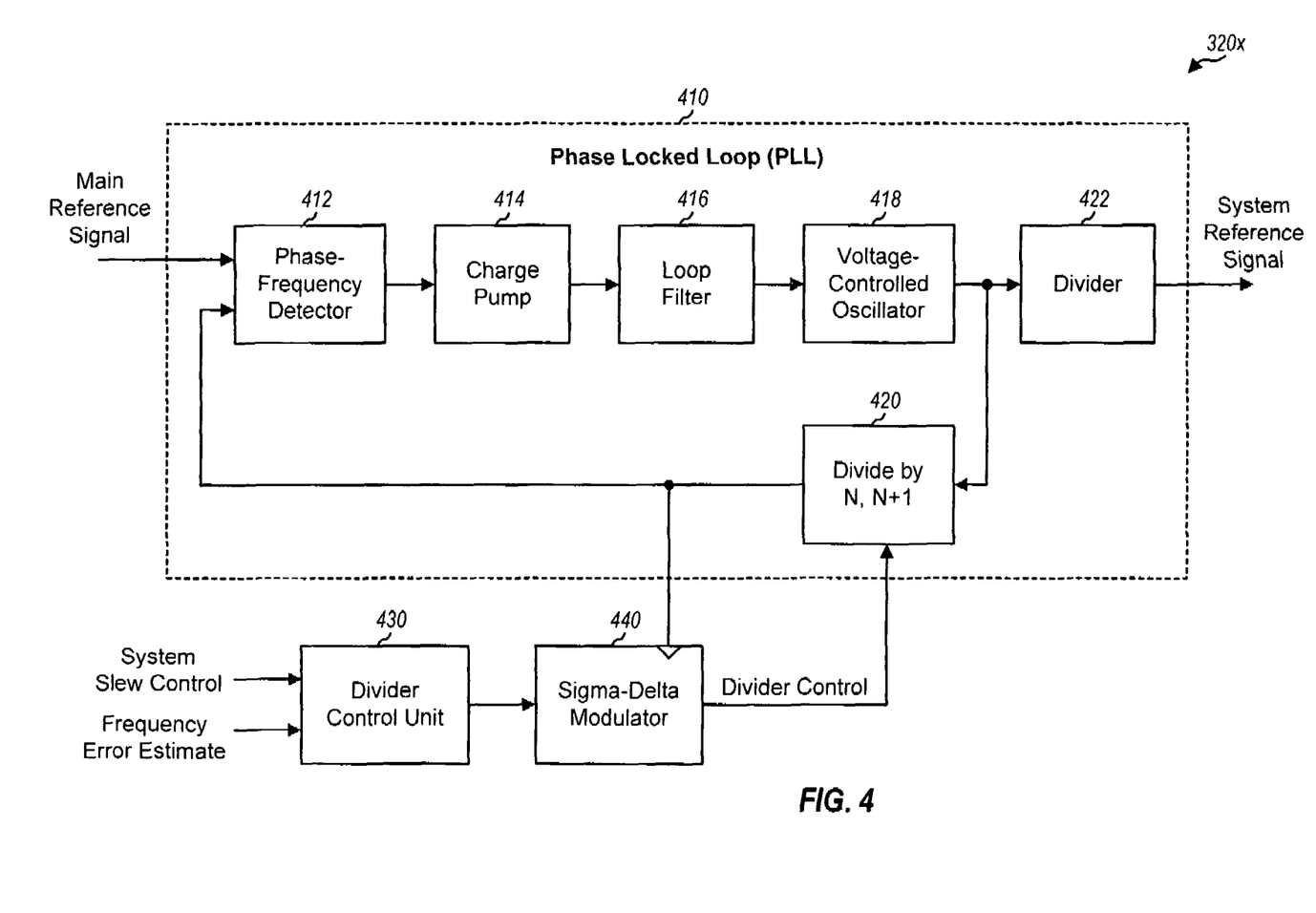
FIG. 4 shows a sigma-delta frequency synthesizer.

FIG. 4 shows an embodiment of a sigma-delta frequency synthesizer 320x, which may be used for each of frequency synthesizers 320a, 320b and 320c in FIG. 3. Sigma-delta frequency synthesizer 320x includes a PLL 410, a divider control unit 430, and a sigma-delta modulator 440.

Within PLL 410, a phase-frequency detector 412 receives the main reference signal from reference oscillator 250 and a divided signal from a divider 420, compares the phases of the two signals, and provides a detector signal that indicates the phase error between the two signals. A charge pump 414 generates an error signal that is proportional to the detected phase error. A loop filter 416 filters the error signal and provides a control voltage for a voltage-controlled oscillator (VCO) 418. Loop filter 416 adjusts the control voltage such that the phase or frequency of the divided signal is locked to the phase or frequency of the main reference signal. VCO 418 generates an oscillator signal having a frequency that is determined by the control voltage. Divider 420 divides the oscillator signal in frequency by a factor of N or N+1 and provides the divided signal to phase-frequency detector 412. In general, N may be any integer value. A divider 422 divides the oscillator signal by an integer factor and provides a system reference signal. Alternatively, the oscillator signal may be buffered and provided as the system reference signal.

Divider control unit 430 receives the frequency error estimate and the slew control and generates a divider ratio R. VCO 418 may be designed to operate at a desired frequency of $f_{vco}$, which may be one or multiple times the frequency of the system reference signal. The divider ratio for divider 420 may be expressed as:

$$R = \frac{f_{vco}}{f_{ref}} = \frac{f_{vco}}{f_{target} - f_{err}}, \qquad \text{Eq (1)}$$

where $f_{target}$ is the target frequency for reference oscillator 250, and $f_{err}$ is the frequency error between the actual frequency $f_{ref}$ of reference oscillator 250 and the target frequency, or $f_{err} = f_{target} - f_{ref}$.

The target frequency is also referred to as the nominal reference frequency.

As shown in equation (1), the divider ratio R accounts for frequency error in the main reference signal. This frequency error may come from various sources, as noted above, and may be estimated, e.g., based on a CDMA pilot. If the frequency error is zero, then the divider ratio R is equal to $f_{vco}/f_{target}$. If the reference frequency is lower than the target frequency, then a higher divider ratio is used to account for the negative frequency error. Conversely, if the reference frequency is higher than the target frequency, then a lower divider ratio is used to account for the positive frequency error. The divider ratio is adjusted to compensate for the frequency error, in units of parts per million (ppm). Frequency synthesizer 320x provides the desired frequency and further compensates for the frequency error of the main reference signal.

Divider control unit 430 determines the divider ratio R based on the frequency error estimate and the known $f_{vco}$ and $f_{target}$ frequencies, e.g., as shown in equation (1). The $f_{target}$ frequency is the same for all systems. The $f_{vco}$ frequency may be different for different systems. Divider control unit 430 may also freeze the divider ratio, limit the amount of change to the divider ratio, and/or limit the rate of change to the divider ratio based on the slew control.

In an embodiment, divider control unit 430 determines and provides an L-bit fractional portion of the divider ratio R, where in general L may be any value. The divider ratio R ranges between integer values of N and N+1, or $N \leq R \leq N+1$. The divider ratio may be expressed in fractional form as: R=N+Frac, where N is the integer portion and Frac is the fractional portion of the divider ratio. Divider control unit 430 may quantize the fractional portion to L bits. L may be selected to achieve the desired frequency resolution and may be 10, 16, or some other number of bits.

Sigma-delta modulator 440 receives the L-bit fractional portion from divider control unit 430 and generates a divider control for divider 420. In the embodiment shown in FIG. 4, the divider control is a 1-bit control that instructs divider 420 to divide by N or N+1. For example, a logic low ('0') on the divider control may correspond to divide by N, and a logic high ('1') on the divider control may correspond to divide by N+1. The percentage of zeros on the divider control is determined by, and is equal to, the fractional portion of the divider ratio. However, the zeros are distributed on the divider control in a manner such that quantization noise is shifted to higher frequencies and good phase noise characteristic is achieved for the oscillator signal from VCO 418.

In another embodiment, sigma-delta modulator 440 receives the L-bit fractional portion from divider control unit 430 and generates an M-bit divider control for divider 420, where M may be any integer value greater than one. In yet another embodiment, divider control unit 430 provides an L-bit divider ratio, and sigma-delta modulator 440 generates an M-bit divider control for divider 420. In both embodiments, divider 420 may divide the oscillator signal by one of $2^M$ possible integer divider ratios, as determined by the M-bit divider control. Divider control unit 430 and sigma-delta modulator 440 may also be implemented in other manners.

Sigma-delta modulator 440 may be implemented with various designs. For example, sigma-delta modulator 440 may be implemented with a cascaded topology, a Cutler topology, a Mash topology, and so on. Sigma-delta modulator 440 may also have any order, e.g., first, second, third, or higher order. Better noise shaping may be achieved with higher order.

Figure 5:
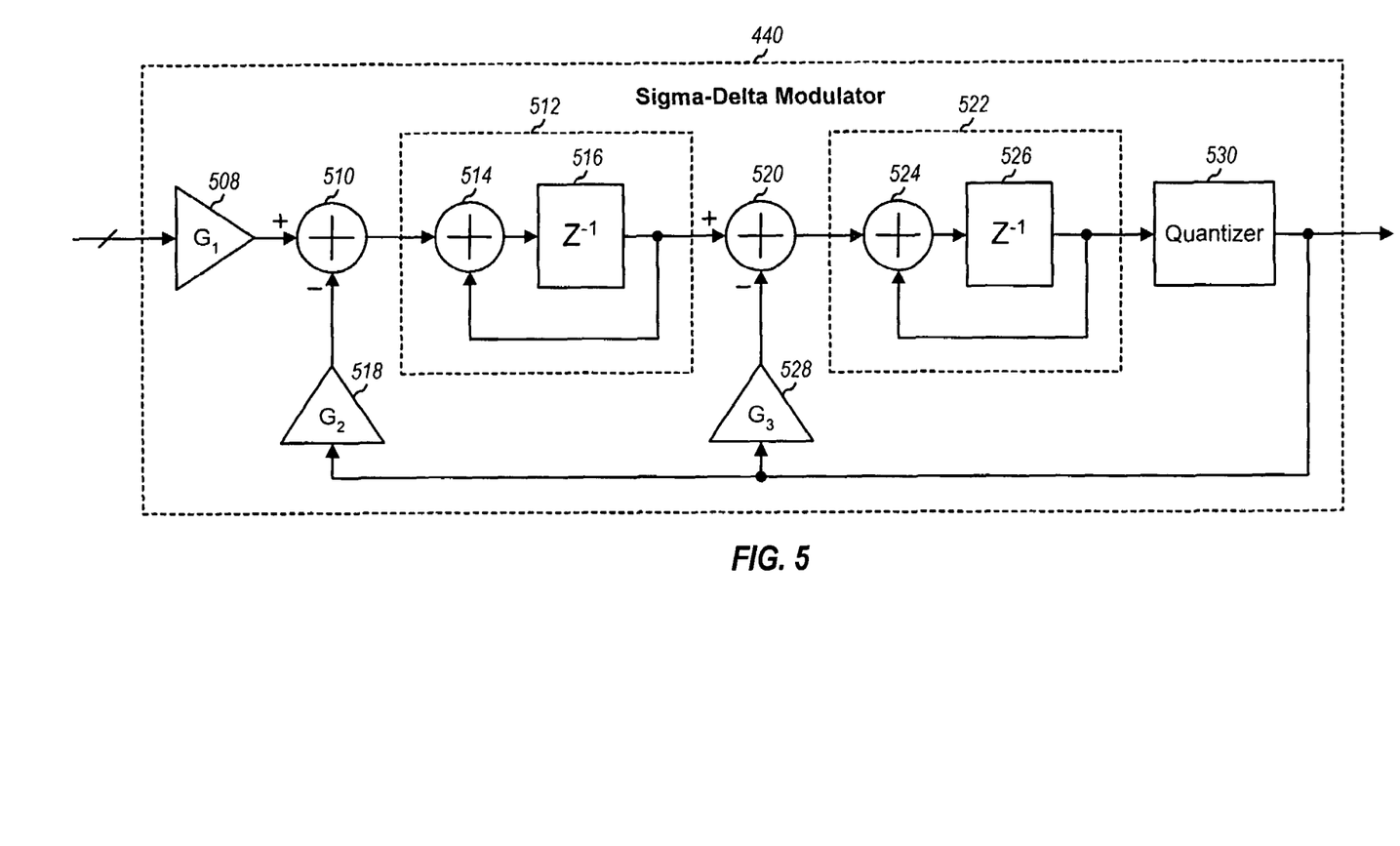
FIG. 5 shows a second-order sigma-delta modulator.

FIG. 5 shows a block diagram of an embodiment of sigma-delta modulator 440, which is a second-order sigma-delta modulator. In this embodiment, sigma-delta modulator 440 includes an input gain element 508, two stages of noise shaping, and a quantizer 530. Gain element 508 receives and scales an input value from divider control unit 430 with a gain of $G_1$.

For the first noise shaping stage, a summer 510 subtracts the output of a gain element 518 from the output of gain element 508 and provides the difference to a filter section 512. Filter section 512 includes a summer 514 and a delay element 516. Summer 514 sums the output of summer 510 with the output of delay element 516. Delay element 516 receives the output of summer 514 and provides a delay of one clock period. For the second noise shaping stage, a summer 520 subtracts the output of a gain element 528 from the output of delay element 516 and provides the difference to a filter section 522. Within filter section 522, a summer 524 sums the output of summer 520 with the output of a delay element 526. Delay element 526 receives the output of summer 524 and provides a delay of one clock period. Delay elements 516 and 526 may be implemented with shift registers that are triggered by the divided signal from divider 420.

Quantizer 530 quantizes the output of delay element 526 and provides an output value for the divider control. Gain element 518 scales the output value with a gain of $G_2$, and gain element 528 scales the output value with a gain of $G_3$. The gains $G_1$, $G_2$ and $G_3$ may be selected to achieve the desired transfer function for sigma-delta modulator 440.

FIG. 5 shows an exemplary design of sigma-delta modulator 440. Sigma-delta modulators of other topologies and/or other orders may also be used.

The use of a sigma-delta modulator in a frequency synthesizer may provide certain advantages. The sigma-delta modulator provides dithering to avoid spurious tones in the oscillator signal and also performs noise shaping to push quantization noise to higher frequencies. The dithering and noise shaping may provide good phase noise characteristics for the oscillator signal and hence the system reference signal. The sigma-delta modulator may be designed with any number of bits to achieve the desired frequency resolution for the system reference signal.

In another embodiment, a multi-modulus divider (e.g., an MN counter) is used to perform divide by a non-integer value, which is also commonly referred to as fractional-N. A non-integer divider ratio may be approximated by a ratio of two integer values N and M, or N/M. (The N for MN counter is different from the N for divider 420.) Higher precision may be achieved for the non-integer divider ratio by using more bits for N and M.

In yet another embodiment, a combination of a sigma-delta modulator and an MN counter is used. The MN counter may be implemented with a portion of the circuitry for the sigma-delta modulator. Either the sigma-delta modulator or the MN counter may be selected for use, e.g., depending on the requirements of the system or application being supported. For example, the sigma-delta modulator may be used if good performance is required. The MN counter may be used whenever the performance of the MN counter is acceptable. The MN counter may have lower power consumption.

A fractional-N divider may also be implemented with other designs. In all embodiments, the divider ratio may be changed dynamically to maintain the desired frequency accuracy in the presence of changes in operating conditions, e.g., temperature. A continuum of divisors (e.g., irrational as well as rational numbers) would allow for selection of any desired divisor value and would also allow for smooth transition from one divisor to another with no jump in output frequency. A continuum of divisors may be approximated by a sigma-delta modulator with high precision achieved with a sufficient number of bits.

Wireless device 110 may receive a CDMA signal from a base station via multiple signal paths, e.g., a line-of-sight path and/or reflected paths. The received CDMA signal may thus include multiple signal instances, with each signal instance having a particular complex gain and a particular propagation delay determined by the signal path via which that signal instance is received. A searcher may process the $C_{in}$ input samples to identify signal instances of sufficient strength. These signal instances may then be assigned for processing.

Figure 6:
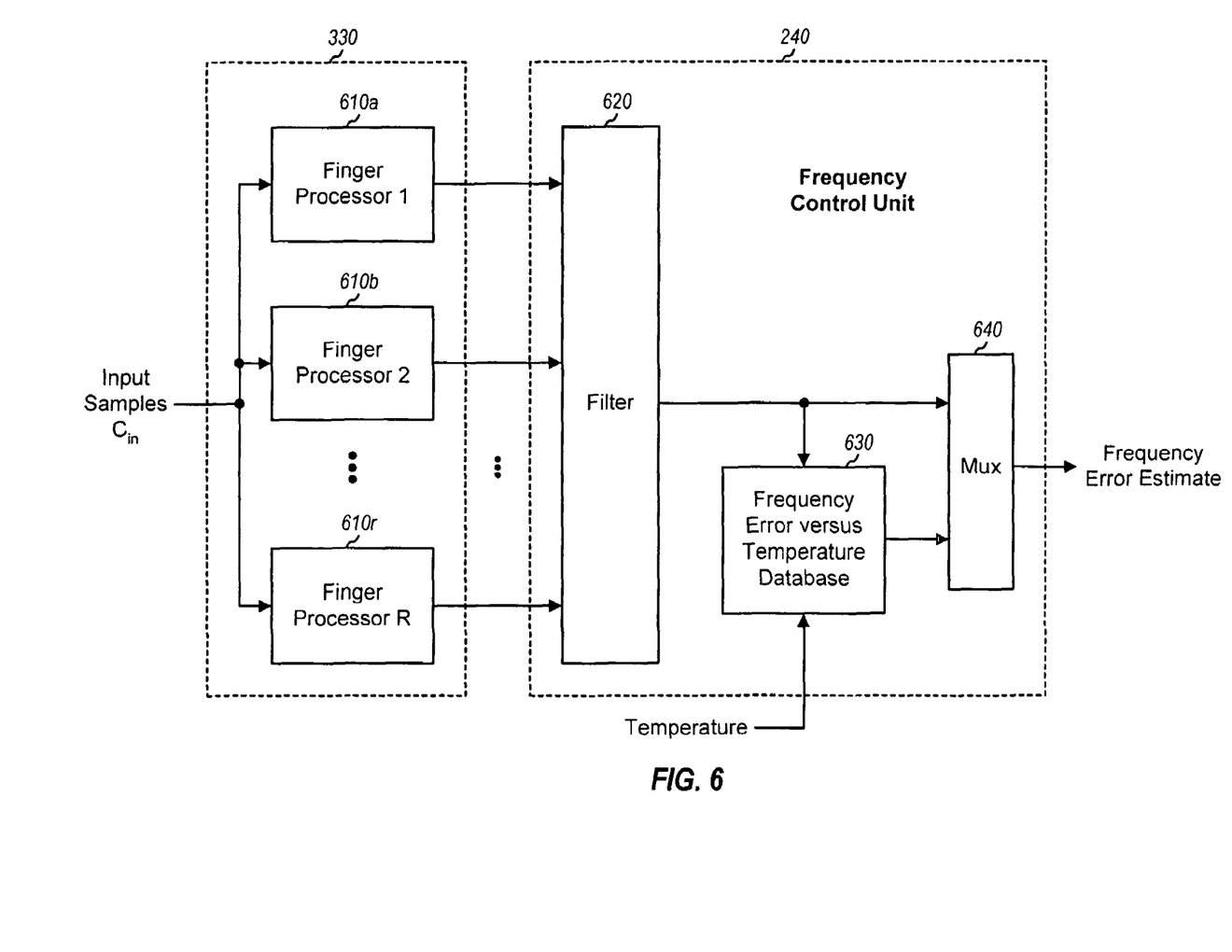
FIG. 6 shows a CDMA processor and a frequency control unit.

FIG. 6 shows an embodiment of CDMA processor 330 and frequency control unit 240 in FIG. 3. In this embodiment, CDMA processor 330 includes multiple (R) finger processors 610a through 610r. Each finger processor 610 may be assigned to process a different signal path of interest. Each finger processor 610 may process the $C_{in}$ input samples to recover pilot symbols sent in a CDMA signal and may further estimates frequency error based on the recovered pilot symbols. The assigned finger processors may provide initial estimates of the frequency error to frequency control unit 240.

In the embodiment shown in FIG. 6, frequency control unit 240 includes a filter 620, a database 630, and a multiplexer (Mux) 640. Filter 620 receives the initial estimates of frequency error from the assigned finger processors and may average the initial estimates across finger processors and/or over time. Filter 620 may perform unweighted averaging across the finger processors. Alternatively, filter 620 may scale the initial estimate from each finger processor based on its received signal strength and may perform weighted averaging across the finger processors. Filter 620 may also average the initial estimates over time with a suitably selected filter. Filter 620 provides a frequency error estimate in each update interval.

Database 630 may store a database of frequency error versus temperature for reference oscillator 250. Database 630 may receive a temperature measurement from thermistor 312 in FIG. 3. When wireless device 110 is receiving a CDMA signal, filter 620 provides a frequency error estimate for reference oscillator 250 for the current temperature. Database 630 may store the frequency error estimate and the corresponding temperature. When wireless device 110 is not receiving a CDMA signal, database 630 may provide the stored frequency error estimate for the current temperature. A database of frequency error versus temperature may thus be built up when receiving a CDMA signal. This database may be updated to account for aging. The database may be used to correct the frequency error of reference oscillator 250 due to temperature when not receiving a CDMA signal. Multiplexer 640 receives the frequency error estimate from filter 620 and/or the frequency error estimate from database 630, provides the frequency error estimate from filter 620 when receiving a CDMA signal, and provides the frequency error estimate from database 630 when not receiving a CDMA signal.

In the embodiment described above, the frequency error of reference oscillator 250 is estimated based on one system, e.g., CDMA. In another embodiment, the frequency error is estimated based on multiple systems received by wireless device 110. For example, the frequency error may be estimated based on measurements for CDMA and GPS. The frequency error estimates from different systems may be averaged to obtain an average frequency error estimate, which is provided to filter 620. Alternatively, the frequency error estimates from the most accurate system currently received by wireless device 110 may be selected.

A separate frequency control unit may also be used for each system requiring closed-loop frequency tracking. The frequency control unit for each system may estimate the frequency error for that system and may provide a frequency error estimate to divider control unit 430 for the associated frequency synthesizer 320. Divider control unit 430 may then generate a suitable divider ratio to correct the frequency error.

FIG. 4 shows a sigma-delta frequency synthesizer that may be used for one system. Multiple sigma-delta frequency synthesizers for the multiple systems may be operated based on the same main reference signal, as shown in FIG. 3. Each sigma-delta frequency synthesizer may include a VCO designed for the frequency needed by the associated system. Each sigma-delta frequency synthesizer may correct the frequency error of the main reference signal, which may be estimated based on CDMA and/or some other system. Each sigma-delta frequency synthesizer may use a different divider ratio to obtain the desired frequency for the associated system. Furthermore, each sigma-delta frequency synthesizer may be independently controlled by the associated slew control, e.g., to freeze the frequency synthesizer or to limit the rate or magnitude of change by the frequency synthesizer. The VCO as well as other PLL components for each sigma-delta frequency synthesizer may be implemented on-chip, which may reduce cost, power consumption, and circuit area.

LO generator 270 in FIG. 2 may also be implemented with multiple frequency synthesizers, e.g., in similar manner as clock generator 260 in FIG. 3. Each frequency synthesizer for LO generator 270 may be implemented as shown in FIG. 4 or with some other design. The VCOs for the frequency synthesizers within LO generator 270 may operate at frequencies different from the frequencies of the VCOs in clock generator 260.

Depending on the desired frequency, numerically controlled oscillators (NCOs) may also be used in place of VCOs in the frequency synthesizers. An NCO receives an input clock (e.g., the main reference signal) and generates an output clock having a frequency that is a fraction of the input clock frequency. An NCO may be implemented with digital circuits The frequency synthesizer for each system may be designed to meet the requirements of the associated system. For example, sigma-delta frequency synthesizers with full capability may be used for CDMA and GPS, and simple fractional dividers with no PLL and no frequency correction capability for temperature compensation may be used for WLAN and Bluetooth. If multiple systems have similar or related reference signal requirements, then these systems may share a common sigma-delta frequency synthesizer. For example, the VCO frequency may be selected such that a reference signal for one system may be obtained by dividing the oscillator signal by one integer value, and a reference signal for another system may be obtained by dividing the same oscillator signal by another integer value.

In the embodiment shown in FIG. 2, the sampling clocks and the LO signals for all systems are generated based on the main reference signal from reference oscillator 250. Without frequency correction by the sigma-delta frequency synthesizer, the input samples for a given system may have (1) frequency error (sometimes referred to as "frequency Doppler") due to error in the LO signal used for frequency downconversion, and (2) timing error (sometimes referred to as "code Doppler") due to error in the sampling clock used for digitization. The embodiment in FIG. 2 corrects both frequency and timing errors simultaneously by applying the correction to both the LO generator and the clock generator.

In another embodiment, the frequency and timing errors are correctly separately, e.g., after the signal has been downconverted to baseband and digitized. The frequency error in the input samples may be corrected with a digital rotator that multiplies the input samples with a complex sinusoid determined by a frequency error estimate. A frequency control loop may derive the frequency error estimate, e.g., based on a pilot. The timing error in the input samples may be corrected with a re-clocking circuit or a re-sampling circuit that generates samples at the correct timing. A time tracking loop may estimate the timing error and generate a timing control for the re-clocking or re-sampling circuit. The embodiment shown in FIG. 2 corrects the frequency error prior to downconversion. This may have an advantage in that the signal is not impaired by being too close to a band edge of any of the filters in the receive path (e.g., filter 222a or 226a) when a large frequency error is present.

For clarity, much of the description above is for the receive portion of wireless device 110. The techniques may also be used for the transmit portion of wireless device 110. An LO generator with multiple frequency synthesizers may be used for multiple transmitters for multiple systems. Each of these frequency synthesizers may be implemented, e.g., as shown in FIG. 4. Rotator and/or re-sampling circuits may also be used on the transmit path for each system, if appropriate.

The techniques described herein may be used to generate an accurate reference signal for each system that needs one. Each system may independently control its frequency synthesizer to meet the requirements of that system. All frequency synthesizers may be operated based on a common main reference signal that may be generated by a fixed crystal oscillator. The frequency error of this crystal oscillator may be estimated by one or more systems and may be removed by all frequency synthesizers.

Figure 7:
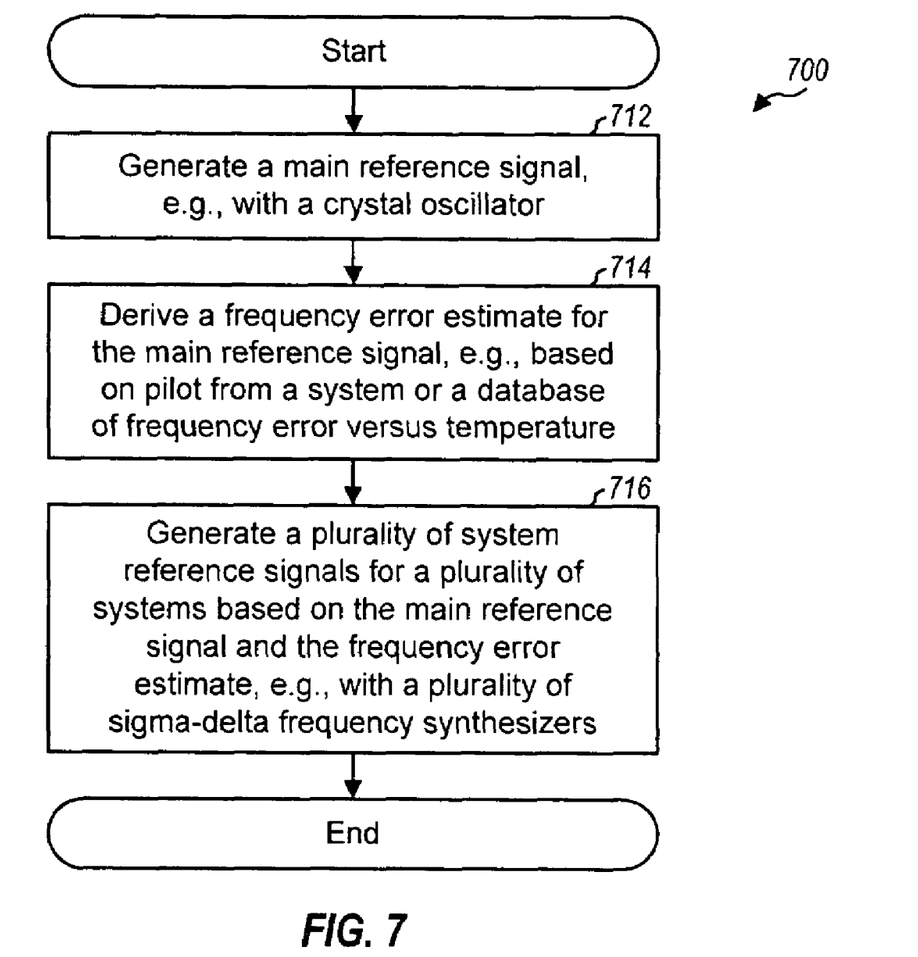
FIG. 7 shows a process for generating reference signals for multiple systems.

FIG. 7 shows an embodiment of a process 700 for generating reference signals for multiple systems. A main reference signal is generated, e.g., with a crystal oscillator (block 712). A frequency error estimate for the main reference signal is derived, e.g., based on pilot from a system or a database of frequency error versus temperature (block 714). A plurality of system reference signals are generated for a plurality of systems based on the main reference signal and the frequency error estimate, e.g., with a plurality of sigma-delta frequency synthesizers (block 716).

In an embodiment of block 714, input samples for a system (e.g., a CDMA system) are processed to obtain initial estimates of the frequency error of the main reference signal. The frequency error estimate is then derived based on the initial estimates of the frequency error. In another embodiment of block 714, a temperate measurement is obtained. A frequency error corresponding to the temperature measurement is retrieved from the database of frequency error versus temperature and provided as the frequency error estimate for the main reference signal.

In an embodiment of block 716, a divider ratio is derived for each system based on the frequency error estimate and a slew control for the system. The slew control may freeze the divider ratio, limit the rate of change of the divider ratio, or limit the magnitude of the divider ratio. A divider control is generated for each system based on the divider ratio for the system and with a sigma-delta modulator. A system reference signal is generated for each system based on the divider control for the system. The system reference signal may be a clock signal, an LO signal, or some other signal.

The techniques described herein may be implemented by various means, e.g., with hardware, firmware, software, or a combination thereof. For a hardware implementation, the units and circuits described herein may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof. For example, clock generator 260 in FIG. 3 may be implemented within an ASIC, an RF integrated circuit (RFIC), or a combination of both.

Certain aspects of the techniques may be implemented with software and/or firmware (e.g., modules such as procedures, functions, and so on) that perform the functions described herein. The firmware and/or software codes may be stored in a memory (e.g., memory 282 in FIG. 2) and executed by a processor (e.g., processor 280). The memory may be implemented within the processor or external to the processor.

The previous description of the disclosed embodiments is provided to enable any person skilled in the art to make or use the disclosure. Various modifications to these embodiments will be readily apparent to those skilled in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. An apparatus configured to support multiple communication systems, comprising:
   a first control unit operative to estimate frequency error of a main reference signal and to provide a frequency error estimate;
   a first frequency synthesizer operative to receive the main reference signal, the frequency error estimate, and a first slew control and to generate a first reference signal for a first communication system; and
   a second frequency synthesizer operative to receive the main reference signal, the frequency error estimate, and a second slew control and to generate a second reference signal for a second communication system, wherein a slew control is used to control the operation of a frequency synthesizer, wherein the first slew control and the second slew control are different, and wherein at least one frequency synthesizer corrects the frequency error of the main reference signal based on the frequency error estimate from the first control unit.

2. The apparatus of claim 1, further comprising:
   a crystal oscillator operative to generate the main reference signal.

3. The apparatus of claim 1, wherein each frequency synthesizer comprises
   a sigma-delta modulator operative to generate a divider control, and
   a phase locked loop (PLL) operative to receive the main reference signal and the divider control and to generate a system reference signal.

4. The apparatus of claim 3, wherein the PLL comprises
   a voltage controlled oscillator (VCO) operative to generate an oscillator signal, and
   a divider operative to divide the oscillator signal by multiple integer values selected by the divider control from the sigma-delta modulator.

5. The apparatus of claim 3, wherein each frequency synthesizer further comprises a second control unit operative to generate a divider ratio based on the frequency error estimate and to provide an output for the sigma-delta modulator.

6. The apparatus of claim 5, wherein the second control unit further receives a slew control and generates the divider ratio based on the frequency error estimate and the slew control.

7. The apparatus of claim 6, wherein the second control unit is operative to freeze the divider ratio, to limit rate of change of the divider ratio, or to limit magnitude of the divider ratio based on the slew control.

8. The apparatus of claim 1, wherein the first control unit comprises
a filter operative to receive initial estimates of the frequency error of the main reference signal and to derive the frequency error estimate based on the initial estimates of the frequency error.

9. The apparatus of claim 8, further comprising:
a data processor operative to process input samples for a cellular system and to provide the initial estimates of the frequency error of the main reference signal.

10. The apparatus of claim 8, further comprising:
a data processor operative to process input samples for a Code Division Multiple Access (CDMA) system and to provide the initial estimates of the frequency error of the main reference signal.

11. The apparatus of claim 8, wherein the first control unit further comprises
a memory operative to store a database of frequency error versus temperature, to receive a temperature measurement, and to provide a frequency error corresponding to the temperature measurement as the frequency error estimate for the main reference signal.

12. The apparatus of claim 1, wherein the communication systems comprise a cellular system and a satellite positioning system.

13. The apparatus of claim 1, wherein the first communication system is a Code Division Multiple Access (CDMA) system and the second communication system is a Global Positioning System (GPS).

14. The apparatus of claim 13, wherein the second slew control freezes the second frequency synthesizer during an integration period to achieve a stable frequency.

15. The apparatus of claim 14, wherein the second slew control enables the second frequency synthesizer after completing the integration and allows the second frequency synthesizer to be updated.

16. The apparatus of claim 1, wherein the communication systems comprise Bluetooth, wireless local area network (WLAN), or both.

17. The apparatus of claim 1, wherein the system reference signals are clock signals.

18. The apparatus of claim 1, wherein the system reference signals are local oscillator (LO) signals.

19. The apparatus of claim 1, wherein a slew control limits how rapidly a frequency synthesizer can adjust a frequency of a reference signal generated by the frequency synthesizer.

20. The apparatus of claim 1, wherein a slew control limits how much a frequency synthesizer can adjust a frequency of a reference signal generated by the frequency synthesizer.

21. An integrated circuit comprising:
a control unit operative to estimate frequency error of a main reference signal and to provide a frequency error estimate;
a first frequency synthesizer operative to receive the main reference signal, the frequency error estimate, and a first slew control and to generate a first reference signal for a first communication system; and
a second frequency synthesizer operative to receive the main reference signal, the frequency error estimate, and a second slew control and to generate a second reference signal for a second communication system, wherein a slew control is used to control the operation of a frequency synthesizer, wherein the first slew control and the second slew control are different, and wherein at least one frequency synthesizer corrects the frequency error of the main reference signal based on the frequency error estimate from the control unit.

22. The integrated circuit of claim 21, wherein each frequency synthesizer comprises
a sigma-delta modulator operative to generate a divider control for a phase locked loop (PLL).

23. The integrated circuit of claim 21, further comprising:
a memory operative to store a database of frequency error versus temperature, to receive a temperature measurement, and to provide a frequency error corresponding to the temperature measurement as the frequency error estimate for the main reference signal.

24. A wireless device comprising:
a crystal oscillator operative to generate a main reference signal;
a control unit operative to estimate frequency error of the main reference signal and to provide a frequency error estimate;
a first frequency synthesizer operative to receive the main reference signal, the frequency error estimate, and a first slew control and to generate a first reference signal for a first communication system; and
a second frequency synthesizer operative to receive the main reference signal, the frequency error estimate, and a second slew control and to generate a second reference signal for a second communication system, wherein a slew control is used to control the operation of a frequency synthesizer, wherein the first slew control and the second slew control are different, and wherein at least one frequency synthesizer corrects the frequency error of the main reference signal based on the frequency error estimate from the control unit.

25. The wireless device of claim 24, wherein each frequency synthesizer comprises
a sigma-delta modulator operative to generate a divider control, and
a phase locked loop (PLL) operative to receive the main reference signal and the divider control and to generate a system reference signal.

26. The wireless device of claim 24, further comprising:
a data processor operative to process input samples for a Code Division Multiple Access (CDMA) system and to provide initial estimates of the frequency error of the main reference signal, and wherein the control unit is operative to derive the frequency error estimate based on the initial estimates of the frequency error.

27. The wireless device of claim 24, wherein the control unit comprises
a memory operative to store a database of frequency error versus temperature, to receive a temperature measurement, and to provide a frequency error corresponding to the temperature measurement as the frequency error estimate for the main reference signal.

28. A method comprising:
generating a main reference signal;
deriving a frequency error estimate for the main reference signal;

generating a first reference signal for a first communication system using the main reference signal, the frequency error estimate, and a first slew control; and generating a second reference signal for a second communication system using the main reference signal, the frequency error estimate, and a second slew control, wherein a slew control is used to control the operation of a frequency synthesizer, and wherein the first slew control and the second slew control are different.

29. The method of claim 28, wherein the generating the reference signals comprises generating a divider control for each system based on the frequency error estimate and with a sigma-delta modulator, and generating a system reference signal for each system based on the divider control for the system.

30. The method of claim 29, wherein the generating the reference signals comprises receiving a slew control for each system, the slew control configurable to freeze a divider ratio, to limit rate of change of the divider ratio, or to limit magnitude of the divider ratio, and generating the divider control for each system based on the divider ratio for the system.

31. The method of claim 28, wherein the deriving the frequency error estimate comprises obtaining a temperature measurement, obtaining a frequency error corresponding to the temperature measurement from a database of frequency error versus temperature, and providing the frequency error obtained from the database as the frequency error estimate for the main reference signal.

32. An apparatus comprising:

means for generating a main reference signal;

means for deriving a frequency error estimate for the main reference signal;

means for generating a first reference signal for a first communication system using the main reference signal, the frequency error estimate, and a first slew control; and means for generating a second reference signal for a second communication system using the main reference signal, the frequency error estimate, and a second slew control, wherein a slew control is used to control the operation of a frequency synthesizer, and wherein the first slew control and the second slew control are different.

33. The apparatus of claim 32, wherein the means for generating the reference signals comprises means for generating a divider control for each system based on the frequency error estimate and with a sigma-delta modulator, and means for generating a system reference signal for each system based on the divider control for the system.

34. The apparatus of claim 33, wherein the means for generating the reference signals comprises means for receiving a slew control for each system, the slew control configurable to freeze a divider ratio, to limit rate of change of the divider ratio, or to limit magnitude of the divider ratio, and means for generating the divider control for each system based on the divider ratio for the system.

35. The apparatus of claim 32, wherein the means for deriving the frequency error estimate comprises means for obtaining a temperature measurement, means for obtaining a frequency error corresponding to the temperature measurement from a database of frequency error versus temperature, and means for providing the frequency error obtained from the database as the frequency error estimate for the main reference signal.

\* \* \* \* \*